United States Patent
Willard et al.

(10) Patent No.: US 6,238,749 B1
(45) Date of Patent: May 29, 2001

(54) METHOD OF PROVIDING A METAL PATTERN ON AN ELECTRICALLY INSULATING SUBSTRATE IN AN ELECTROLESS PROCESS

(75) Inventors: Nicolaas P. Willard; Henricus J. A. P. Van Den Boogaard; Cornelis H. J. Van Den Brekel; Elisabeth Van Der Sluis-Van Der Voort, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 1083 days.

(21) Appl. No.: 08/652,253

(22) Filed: May 23, 1996

Related U.S. Application Data

(63) Continuation of application No. 08/321,187, filed on Oct. 11, 1994, now abandoned.

(30) Foreign Application Priority Data

Oct. 11, 1993 (BE) .................................................. 09301063

(51) Int. Cl.[7] ...................................................... B05D 5/12
(52) U.S. Cl. ........................... 427/510; 427/555; 427/123; 427/304; 427/305; 427/404; 427/437; 427/443.1; 427/443.2
(58) Field of Search ..................................... 427/510, 555, 427/123, 304, 305, 404, 437, 443.1, 443.2

(56) References Cited

U.S. PATENT DOCUMENTS

| | | |
|---|---|---|
| 2,430,581 * | 11/1947 | Pessel . |
| 4,681,774 | 7/1987 | Halliwell et al. ................... 427/53.1 |
| 4,824,693 * | 4/1989 | Schlipf et al. .......................... 427/98 |
| 4,882,200 | 11/1989 | Liu et al. ............................. 427/53.1 |
| 4,996,075 | 2/1991 | Ogawa et al. ......................... 427/12 |
| 5,384,154 * | 1/1995 | De Bekker et al. ................. 427/123 |

FOREIGN PATENT DOCUMENTS

| | | | |
|---|---|---|---|
| 0287843 | 10/1988 | (EP) | ............................... C23C/18/16 |
| 0400750 | 12/1990 | (EP) | ............................... H01J/31/12 |
| 0518422 | 12/1992 | (EP) | ............................... C03C/17/10 |
| 0557952 | 9/1993 | (EP) | ............................... C23C/18/16 |
| 0577187 | 1/1994 | (EP) | ............................... C03C/17/38 |

* cited by examiner

Primary Examiner—Benjamin L. Utech
(74) Attorney, Agent, or Firm—Norman N. Spain

(57) ABSTRACT

Metal patterns (11, 11', 11") can be provided on a glass substrate (1) in an electroless process by modifying the substrate with a silane monolayer (3), nucleating said momolayer with a polymer-stabilized Pd sol (5) and, subsequently, locally removing the Pd nuclei and silane layer (9, 9') with a pulsed laser. Neither a photoresist nor organic solvents are used. The method can very suitably be used for the manufacture of the black matrix on a faceplate of display devices, such as the passive plate for an LCD.

10 Claims, 2 Drawing Sheets

METHOD OF PROVIDING A METAL PATTERN ON AN ELECTRICALLY INSULATING SUBSTRATE IN AN ELECTROLESS PROCESS

This is a continuation of application Ser. No. 08/321,187, filed Oct. 11, 1994, abandoned.

The invention relates to a method of providing a metal pattern on an electrically insulating substrate in an electroless process, in which method the substrate is pretreated and subsequently locally exposed to light, whereafter the substrate is brought into contact with an aqueous metal-salt solution, thereby forming the metal pattern on the unexposed areas.

The invention relates, in particular, to a method of manufacturing a black matrix of metal on a glass faceplate of a display device, such as a colour display tube and a liquid-crystal display device.

Electroless or chemical metallization is a simple and inexpensive method of metallizing dielectric substrates such as glass, ceramics and polymer synthetic resins. For this purpose, electroless metallization baths, such as copper and nickel baths, are used (which comprise complexed metal ions and a reducing agent). On catalytic surfaces the metal ions are reduced to metal. In general, metallic Pd nuclei are provided on the surface to be metallized in order to render said surface catalytic. In a standard procedure the substrate to be metallized is nucleated (termed activation) beforehand by bringing the substrate into contact with either aqueous solutions of, in succession, $SnCl_2$ and $PdCl_2$ or with a colloidal SnPd dispersion. In either case, the Pd nuclei are surrounded by adsorbed $Sn^{4+}$ ions, thereby forming a charge-stabilized Pd sol. The activated surface is subsequently immersed in an electroless metallization bath, causing the surface to be metallized. Said activation methods are non-selective, i.e. the entire substrate surface, such as glass, is nucleated and hence metallized. These activation methods can suitably be used for electroless copper, the strongly reducing formaldehyde being used as the reducing agent.

However, for most electroless nickel baths said activation methods are less suitable due to the reduced reactivity of the reducing agents used, for example hypophosphite, in these baths and due to the lower pH value. This is caused by the use of $Sn^{2+}$ ions in the preparation of the Pd sol, which leads to the formation of $Sn^{4+}$ ions. The $Sn^{4+}$ ions adsorbed on the Pd particles, which ions are used as stabilizers in electroless nickel baths, inhibit the oxidation of the reducing agent. To bring about nickel deposition use must be made of very reactive nickel baths without stabilizers, such as a superalkaline electroless nickel bath on the basis of hypophosphite (pH>14). However, the absence of stabilizers in an electroless nickel bath leads to a poor process control and selectivity as well as the risk of bath instability, i.e. spontaneous nickel formation in the nickel bath. For this reason, commercially available electroless nickel baths comprise stabilizers, such as heavy metal ions, for example $Sn^{2+}$, $Sn^{4+}$ and $Pb^{2+}$, and organic sulphur compounds such as thiourea.

In electronic applications, selective or patterned metallization is often desired. This can be attained in various ways. In a subtractive process, first a uniform metal layer having the desired thickness is deposited on the substrate. Subsequently, a photoresist layer is provided which is exposed in accordance with a pattern and developed, thereby forming a pattern in the resist layer. Finally, the metal layer is etched selectively after which the resist layer is stripped off. In an additive process the substrate is activated with catalytic Pd nuclei. Subsequently, a photoresist layer is provided on the substrate, exposed in accordance with a pattern and developed, thereby forming a pattern in the resist layer. Subsequently, the surface is immersed in an electroless metallization bath, in which process metal is deposited in the desired thickness in the apertures of the resist pattern. Finally, the resist layer is stripped off and the Pd nuclei are removed by a short etching treatment. Both processes have the disadvantage that they require a relatively large number of process steps and involve the use of chemicals which are harmful to the environment, such as the resist stripper and the metal-etching bath. In addition, the provision of resist layers on large glass surfaces is difficult.

It is also known to apply a Pd-acetate or acetyl acetonate film to a substrate by means of spincoating, which film is locally decomposed to metallic palladium by means of a laser. The Pd acetate on the unexposed parts is subsequently removed. The pattern of Pd nuclei thus formed is then metallized in an electroless nickel or copper bath. The disadvantage of this method is the relatively large number of process steps and the high laser power necessary to decompose the Pd acetate. Consequently, the treatment of large glass surfaces is very time-consuming.

In United States Patent Specification U.S. Pat. No. 4,996,075 a description is given of a method of depositing a very thin silver film in accordance with a pattern on an $SiO_2$ surface. In this method the surface is treated with a solution of a silane with a vinyl or acetylene group in an organic solvent, such as carbon tetrachloride and chloroform. As a result of this treatment a monomolecular silane layer is formed on the $SiO_2$ surface, i.e. a silane layer having a thickness equal to the length of the silane molecule is formed. By locally exposing the silane layer to actinic radiation in selected areas, such as an electron beam or light beam, the vinyl or acetylene groups are chemically bonded to one another, thereby forming a polymer layer, and hence are selectively deactivated. Subsequently, the surface is first immersed in a solution of diborane in THF and then in an alkaline solution of hydrogen peroxide, so that the unexposed vinyl groups are converted to hydroxyl groups. Subsequently, the hydroxyl groups are converted to aldehyde groups. A treatment with an aqueous silver nitrate solution causes the silver ions to be reduced by the aldehyde groups to metallic silver, thereby forming a patterned silver layer having a thickness of one atom layer in the unexposed areas. A second monomolecular layer of vinyl silane can be formed on the silver oxide layer by spontaneous conversion of the monoatomic silver layer to a monomolecular silver oxide layer, whereafter the above steps for converting vinyl groups via hydroxyl groups into aldehyde groups are repeated. Subsequently, a second treatment with an aquous silver nitrate solution is carried out resulting in the formation of a second monomolecular silver oxide layer. By repeating these steps many times an alternating laminate of monolayers of silane and monolayers of silver oxide is obtained.

A disadvantage of the known method is the large number of process steps required to obtain a metal pattern of sufficient layer thickness, for example 0.1 μm or more, so that the layer is optically opaque and/or has a sufficiently low electric resistance. Another disadvantage is the use of harmful organic solvents, comprising a vinyl or acetylene group, as the solvent for the silanes. A further disadvantage is formed by the fact that the proposed irradiation of the silane layer causes said layer to be deactivated by mutual bonding of the vinyl or acetylene groups, thereby forming a polymer layer which covers the $SiO_2$ surface. This polymer top layer cannot easily be removed and is often undesired. Due to this polymer layer the $SiO_2$ surface is inaccessible to other surface reactions or causes, for example, bonding problems with other layers to be provided.

SUMMARY OF THE INVENTION

It is an object of the invention to provide, inter alia, a method of providing a metal pattern on an electrically insulating substrate in an electroless process comprising relatively few process steps, and without using photoresist layers and organic solvents. A further object of the invention is to provide a method which can suitably be used for metallizing relatively large substrate surfaces, for example 25×40 cm, in accordance with a pattern. A still further object of the invention is to provide a method which allows commercially available electroless nickel baths to be used.

These objects are achieved by a method as described in the opening paragraph, which is characterized in that the substrate is pretreated by bringing it into contact with an aqueous Pd sol which is stabilized only with a water-soluble polymer, thereby depositing adsorbed Pd nuclei on the substrate, and in that for locally exposing the substrate in selected areas use is made of a pulsed laser light beam of such energy content per pulse that the Pd nuclei are locally removed from the substrate in these selected areas, and in that an electroless metallization bath is used to form the metal pattern on the unexposed areas of the substrate. Dependent upon the water-soluble polymer used, the method can be carried out with glass substrates or on other electrically insulating substrates, such as ceramics and polymer synthetic resins.

DETAILED DESCRIPTION OF THE INVENTION

Figure 1A:
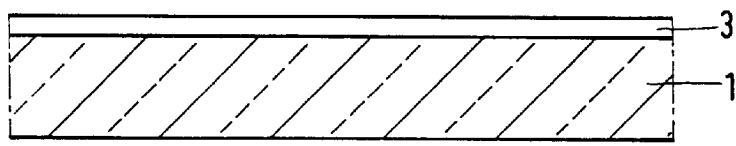
FIG. 1 diagrammatically shows the process steps of a method in accordance with the invention.

One aspect of the method in accordance with the invention is based on the observation that a Pd sol which is not stabilized with $Sn^{4+}$ ions but instead with a water-soluble neutral polymer, i.e. a polymer comprising chains without charges, does not adsorb on a glass surface, whereas an excellent Pd coating is obtained on materials other than glass. In this connection, the term "sol" is to be understood to mean a colloidal dispersion of Pd in water. This phenomenon is probably based on the development of a negative surface charge when a glass surface is present in water. Surface modification of the glass surface by applying even monolayers of another material can influence the adsorption properties of the Pd sol. A glass surface can very suitably be modified by means of various silanes which form a chemical bond with the glass surface. The provision of a (mono)layer of silane is termed silanation. Polymer-stabilized Pd sols do adsorb on silanated glass surfaces and form a catalytic surface for electroless metalization.

It has been found that the adsorbed Pd nuclei can be locally removed in selected areas by exposure to pulsed laser light of sufficient power. A laser which can suitably be used for this purpose is an ArF excimer laser having a wavelength of 193 nm and an energy content of at least 30 mJ per pulse per second. Another suitable laser is a Nd-YaG laser having a wavelength of 532 nm and an energy content of at least 900 mJ per pulse per second. If the wavelength is doubled to 1064 nm, a larger energy content per pulse is required. Alternatively, a $CO_2$ laser having a wavelength of 10,6 μm and an energy content of 5 J per pulse per second can be used. Local exposure to said laser light leads to the formation of a pattern in the adsorbed Pd nuclei. Said pattern of Pd nuclei is subsequently metallized in an electroless metallization bath, thereby forming the metal pattern. By means of this method a very high density of Pd nuclei of $2.10^{15}$ Pd atoms per $cm^2$ is obtained, which leads to a very good initiation of not only electroless copper baths but also all less reactive commercially available electroless nickel baths. The high density of Pd nuclei also brings about a very satisfactory adhesion of the copper or nickel layer as well as a high selectivity for the metallization of the unexposed areas relative to the exposed areas. In this connection, it is possible to substitute glass by quartz, quartz glass and glass ceramics such as Macor™. These latter materials are not activated by a Pd sol which is stabilized by a polymer having neutral chains, but they are activated by the known SnPd sols and by $SnCl_2/PdCl_2$ activation.

Such a polymer activated Pd sol can be prepared by adding a reducing agent other than a $Sn^{2+}$ salt, such as $H_3PO_2$, $NaH_2PO_2$ and dimethyl aminoborane, to an aqueous HCl-containing solution of a Pd salt, such as $PdCl_2$, causing metallic Pd to be formed, and said solution also comprising a water-soluble polymer which stabilizes the sol. Steric hindrance of the polymer chains on the Pd particles precludes flocculation of said particles.

Figure 2:
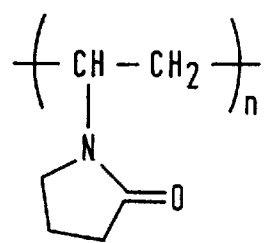
FIG. 2 shows the structural formula of polyvinyl pyrrolidone.

Suitable water-soluble polymers having neutral chains that may be employed are polyvinyl alcohol (PVA) and polyvinyl pyrrolidone (PVP, see FIG. 2). In the case of PVA a heterodisperse sol is obtained having particles ranging from 2–10 nm. When PVP is used, a monodisperse sol is formed having particles of 2 nm. A particle of 2 nm contains approximately 500 Pd atoms. The molecular weight and the polymer concentration are chosen to be such that per Pd particle one polymer chain is adsorbed at said particle. Preferably, PVP having an average molecular weight of approximately 10,000 is used (for example K-15 obtainable from Fluka). A relatively low average molecular weight in combination with said small particles brings about a high density of Pd nuclei on the substrate, resulting in an excellent initiation of the electroless metallization, including the electroless metallization of nickel.

Pd-PVP sols are more stable than Pd-PVA sols, so that the former sol has a longer life cycle. By virtue thereof, a concentrated stock solution of a Pd-PVP sol can be prepared which is diluted, for example 10×, before use.

Another advantage of PVP relative to PVA is that the formation of foam in the nucleating solution is reduced.

Such polymer-stabilized Pd sols are known from European Patent Application EP-A-518422 (PHN 13.743) filed by Applicants. This Patent Application describes a method of selectively metallizing indium-tin oxide (ITO) patterns on glass. Said method uses the selective adsorption of such Pd sols on ITO. The subsequent electroless metallization takes place only on the ITO.

For the metallization of glass substrates, and when polymers having neutral chains such as PVA and PVP are used for the stabilization of the Pd sol, nucleation of the glass surface must be preceded by silanation. In accordance with this aspect of the invention, aqueous solutions of a silane are used to avoid the use of undesirable organic solvents. Suitable silanes are water-soluble aminosilanes comprising at least one alkoxy group. Such silanes include those complying with the formula:

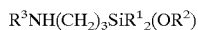

where
- $R^1$=$CH_3$, $C_2H_5$, methoxy or ethoxy and
- $R^2$=$CH_3$ or $C_2H_5$
- $R^3$=H, $CH_3$, $C_2H_5$ or $(CH_2)_m NHR^4$
- $R^4$=H, $CH_3$ or $C_2H_5$ and
- m=1, 2 or 3.

Suitable representatives are 3-aminopropyl triethoxysilane (A 0750 obtainable from Petrarch or γ-APS), 3-aminopropyl trimethoxysilane (A 1100 obtainable from Union Carbide) and N-(2-aminoethyl)-3-aminopropyl trimethoxysilane (A 1120 obtainable from Union Carbide). The concentration of the silane in water is not critical and ranges, for example, between 0.01 and 3 wt. %. The immersion time of the substrate in the silane solution is not critical either for the subsequent Pd adsorption. One of the alkoxy groups of the silane molecule reacts with a hydroxy group of the glass surface and causes chemical bonding. Of course, prior to silanation, the glass surface must be cleaned to a sufficient degree.

The above-mentioned Pd sols, which are stabilized with PVP or PVA, can also be used for the nucleation of substrates other than glass, for example ceramics such as alumina, zirconia, ferrites and indium-tin oxide (ITO), and synthetic resins such as polycarbonate and polymethyl methacrylate. Here, silanation of these substrates is not necessary.

Figure 3:
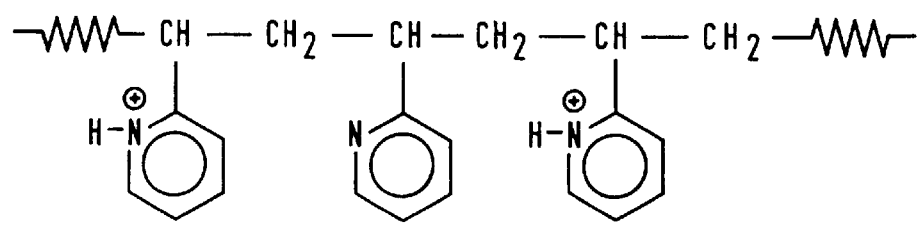
FIG. 3 shows the structural formula of poly-2-vinyl pyridine with a positively charged chain.
Figure 4:
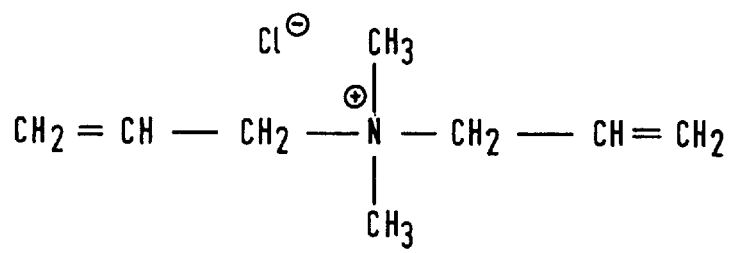
FIG. 4 shows the structural formula of diallyl dimethyl ammonium chloride.

It has been found, however, that glass substrates can be nucleated with Pd sols which have been stabilized with water-soluble polymers having chains with positive charges. An example of a water-soluble polymer having ,positive charges is poly-2-vinylpyridine ($PV_2P$). When the polymer has been dissolved in water, the positive charges are present on certain nitrogen atoms of the pyridine rings (see FIG. 3). A further suitable polymer having positive charges is Merquat 550™ which is obtainable from Merck. This water-soluble polymer is a random copolymer of diallyldimethyl ammonium chloride (FIG. 4) and acrylate amide (FIG. 5) and it is supplied as a 8.5 wt. % solution in water. The nitrogen atoms of the ammonium groups have the positive charges in the copolymer. Due to the negative surface charge of glass in water, such stabilized Pd sols adsorb on glass.

As stated above, the number of Pd atoms adsorbed on the glass surface nucleated with said Pd sols is $2.10^{15}$ per $cm^2$. If Pd-PVA sols are used a density of $3.10^{15}$ Pd atoms per $cm^2$ is attained. Said values are determined by means of XRF (X-ray fluorescence). Such a surface has a very catalytic effect and leads to a reliable electroless metallization process, even in the case of less reactive electroless nickel baths. All known electroless nickel baths can be used, for example nickel baths on the basis of glycine, succinate, pyrophosphate and citrate. Use can also be made of the known, commercially available baths, such as Shipley Niposit 65™, OMI Enplate 426™, Shipley Niposit 468™, OMI Enlyte 512™ and 514™. In addition to a nickel salt such a bath always comprises a reducing agent such as hypophosphite or dimethyl aminoborane. Frequently, stabilizers such as sulphur compounds, tin salts or lead salts are present to preclude the spontaneous deposition of nickel.

The method in accordance with the invention is particularly suitable for the manufacture of a black matrix of metal on faceplates of display devices, such as a passive plate of a liquid-crystal display device (LCD), in particular for passive plates having relatively large dimensions of, for example, 25×40 cm. The black matrix leads to an improved contrast between the three colour filters red, green and blue of the colour filter pattern. In general, a thin chromium film is used for this purpose, in which apertures are formed in a photolithographic process, i.e. providing the photoresist, exposing, developing, etching and stripping off the resist. These apertures constitute the pixels of the passive plate of the LCD and have dimensions of, for example, 50×70 μm.

In accordance with the invention when silation is employed, a cleaned glass plate is treated with an aqueous solution of a silane, thereby forming a (monomolecular) layer of silane on the glass plate. Subsequently, an activation treatment using a Pd sol which is stabilized with a water-soluble polymer takes place. In places where the metal matrix must not be provided, the Pd nuclei are removed with a pulsed laser of sufficient power. Next, the unexposed areas are nickel plated by means of an electroless nickel bath, thereby forming said black matrix. The nickel layer is optically opaque at a thickness of 0.1 μm.

The method in accordance with the invention is completely additive and, moreover, neither photoresists nor developers and etchants which are harmful to the environment are used.

The colour filters are provided in the apertures by means of, for example, screen printing, ink-jet printing or lithographic techniques. After the colour filters have been provided, a polyacrylate top coating, a $SiO_2$ layer and an ITO layer are successively provided.

The method in accordance with the invention can also be used for the manufacture of a black matrix of metal on display screens of colour display tubes, such as cathode ray tubes and faceplates of flat displays such as electron fibre displays, as described in European Patent Application EP-A-400750 (PHN 12.927), filed by Applicants.

Other applications of the method in accordance with the invention include the manufacture of conductor patterns for chip-on-glass, copper patterns for coils in minimotors and the provision of metal electrodes around and in the holes of glass selection plates of said electron fibre displays.

It is noted that in the non-prepublished European Patent Application EP-A-577.187 (PHN 14.105), filed by Applicants, a description is given of a method in which a glass substrate is selectively metallized by subjecting the substrate to the following successive operations: silanation, patterned radiation with UV ozone or laser light, causing the silane layer to be partically removed, and nucleation with a PVA or PVP-stabilized Pd sol. The radiation treatment takes place before the Pd nucleation. Nucleation only takes place on the non-irradiated areas. In an electroless metallization bath the nucleated areas are metallized.

The invention will be explained in greater detail by means of exemplary embodiments and the figures of the drawings.

EXEMPLARY EMBODIMENT 1

A polymer-stabilized Pd sol which can suitably be used in the method in accordance with the invention is prepared as follows. A quantity of 0.6 ml of a $PdCl_2$ solution consisting of 10 g/l of $PdCl_2$ and 350 ml/l of concentrated hydrochloric acid in water is diluted with 38.4 ml of water. A quantity of 0.07 ml of a 1 wt. % polyvinyl pyrrolidone (PVP) solution in water is added to this solution. PVP has the structural formula shown in FIG. 2, in which in this case n amounts to approximately 90. Said PVP is obtained from Fluka, type K-15, and has an average molecular weight of 10,000.

Subsequently, 1 ml of an aqueous 0.625 molar $H_3PO_2$ solution is added while stirring. The Pd sol formed is monodisperse with particles of 2 nm and is used as an activating solution.

FIG. 1 diagrammatically shows the process steps of the method in accordance with the invention, the glass test substrate and the layers to be provided being diagrammatically shown in cross-section. The layer thickness proportions in the Figure do not correspond to the actual proportions.

A borosilicate glass plate 1 (FIG. 1a) having dimensions of 35×35 mm is used as the test substrate. Said test substrate is cleaned with an aqueous solution which contains 1 wt. % of Extran™ (an alkaline detergent obtainable from Merck). The soap residue is removed by rinsing with demineralised water and an UV-ozone treatment for 15 minutes.

The cleaned test substrate is immediately silanated by spinning on a 0.025 wt. % solution of 3-aminopropyl trimethoxysilane (A1100 obtainable from Union Carbide) in water at 3000 r.p.m. for 20 seconds, whereafter the test substrate is heated to 80° C. for 10 minutes. As a result of the reaction of a methoxy or silanol group of said silane with a —SiOH group of the glas surface a silane layer 3 having a thickness of approximately 1–5 nm is formed on the glass surface. The silane used comprises three reactive methoxy groups, so that the silane layer consists of a three-dimensional network (polysiloxane). The silanated test substrate is rinsed with demineralised water and dried.

Figure 1B:
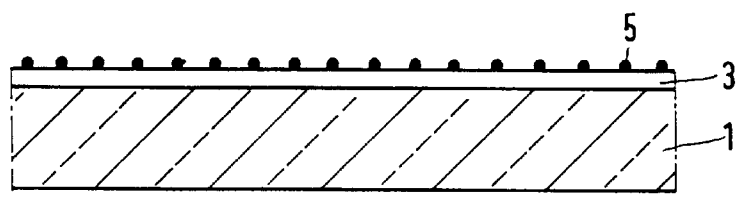

Subsequently, the silanated test substrate is immersed in the abovementioned activating solution of PVP-stabilized Pd sol for 1 minute. Pd nuclei 5 adsorb on the silane layer 3 (FIG. 1b). Analysis using TEM (Transmission Electron Microscopy) shows that the Pd nuclei have a diameter of 2 nm. XRF analysis shows a degree of coverage of $2.10^{15}$ adsorbed Pd atoms per $cm^2$.

Figure 1C:
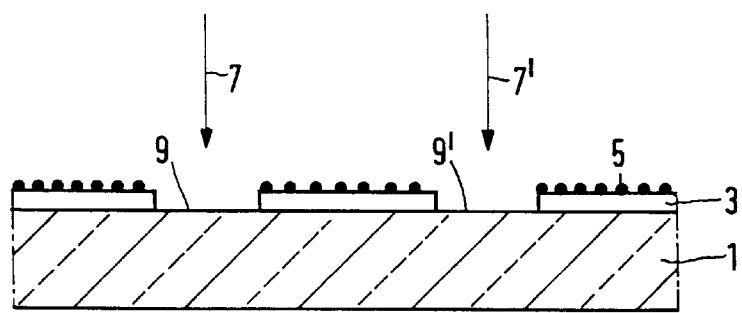
Figure 1D:
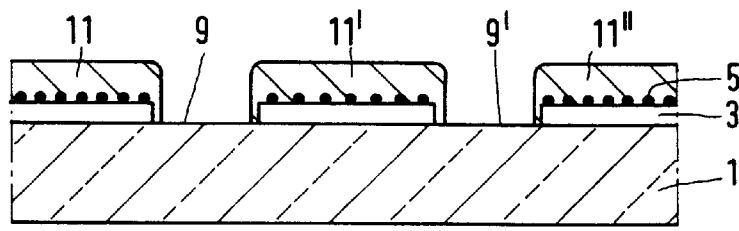

The activating treatment is followed by rinsing in demineralised water, whereafter the activated test substrate is locally irradiated in selected areas with an ArF excimer laser having a wavelength of 193 nm. The laser-light beams are denoted by arrows 7 and 7' (FIG. 1c). The laser is pulsed at a frequency of 1 pulse per second. The energy content of the pulse is 35 mJ. In the areas denoted by reference numerals 9 and 9' (FIG. 1c) both the silane layer 3 and the Pd nuclei 5 are removed down to the glass surface. Pulses having an energy content below 30 mJ per pulse are insufficient to provide a pattern.

Subsequently, the exposed test substrate is introduced into an electroless nickel bath comprising 20 g of $NiCl_2$, 16 g of sodium succinate, 10 g of sodium hypophosphite and 2 g of sodium acetate per litre of water. The nickel bath is acidified with HCl to a pH value of 4.5 and has a temperature of 70° C. After 3 minutes a nickel layer 11, 11' and 11" (FIG. 1d) having a layer thickness of 0.2 $\mu$m is obtained in the unexposed areas of the test substrate. In the exposed areas 9 and 9' no nickel is deposited. In this manner, a patterned nickel layer is formed on the glass test substrate. The adhesion of the nickel layer to the glass surface satisfies the requirements of the tape test.

In the same manner as described above a glass faceplate, having dimensions of 25×40 cm, for an LCD is provided with a black matrix. The nickel pattern formed on the unexposed areas of the faceplate constitutes the black matrix.

EXEMPLARY EMBODIMENT 2

Figure 5:
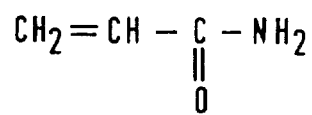
FIG. 5 shows the structural formula of acrylate amide.

Exemplary embodiment 1 is repeated, the Pd sol being stabilized with the random copolymer of diallyldimethyl ammonium chloride (FIG. 4) and acrylate amide (FIG. 5). This copolymer is a concentrated aqueous solution having a concentration of 8.5 wt. % and is obtainable from Merck under the name of Merquat 550™. This concentrated solution is diluted with water to a concentration of 6.5 g/l. A quantity of 0.7 ml of this diluted solution is added to a mixture of 0.6 ml of aqueous $PdCl_2$ solution (1 g/l) and 37.7 ml of water, after which 1 ml of aqueous $H_3PO_2$ solution (0.625 mol/l) is admixed, thereby forming a stabilized Pd sol whose polymer chains adsorbed on the Pd are positively charged.

The glass substrate is cleaned as described hereinabove, whereafter it is immediately immersed in the Pd sol for 1 minute. In this exemplary embodiment silanation of the glass substrate does not take place. The positively charged sol adsorbs on the negatively charged glass surface, thereby forming a catalytic surface for electroless metallization.

The activating treatment is followed by rinsing in demineralised water, after which the activated test substrate is locally irradiated in selected areas with an Nd-YAG laser having a wavelength of 532 nm. Said laser is pulsed at a frequency of 1 pulse per second. The energy content of the pulse is 900 mJ. The Pd nuclei are removed from the exposed areas of the substrate.

Subsequently, the exposed test substrate is introduced into a commercially available electroless nickel bath (Shipley Niposit 65™) for 2 minutes. This bath contains, inter alia, hypophosphite as the reducing agent and $Pb^{2+}$ and S compounds as the stabilizers. Nickel is deposited on the unexposed areas of the test substrate, not on the exposed areas. In this manner, a patterned nickel layer is formed on the glass test substrate. The adhesion of the nickel layer to the glass surface satisfies the requirements of the tape test.

EXEMPLARY EMBODIMENT 3

Exemplary embodiment 2 is repeated, using a glass substrate on which previously 100 nm of $Al_2O_3$ is provided by sputtering. The activation, exposure and metalation of the $Al_2O_3$ surface take place in an identical manner. In this way a nickel pattern is formed on the surface.

The method in accordance with the invention comprises three fundamental process steps, namely activating with a stabilized Pd sol, irradiating in accordance with a pattern using pulsed laser light and selective electroless metalization in, for example, a nickel bath. This method enables a metal pattern to be provided on relatively large substrates in an electroless process comprising relatively few process steps and without using photoresists, developing liquids and organic solvents. The activation and, optionally, silanation take place in aqueous solutions. A reliable electroless metallization process is obtained by virtue of the high density of Pd nuclei attained during the activating treatment.

What is claimed is:

1. A method of providing a metal pattern on an electrically insulating substrate in an electroless process, in which method the substrate is pretreated and subsequently exposed to light according to a pattern, whereafter the substrate is brought into contact with an aqueous metal salt solution to metallize unexposed areas of the substrate, thereby forming the metal-pattern on the substrate, characterized in that the substrate is a glass substrate and is pretreated by bringing it into contact with an aqueous Sn free Pd sol which is stabilized with a water-soluble polymer, thereby depositing Pd nuclei on the substrate, and in that the substrate, thus provided with the Pd nuclei, is exposed according to the pattern to a pulsed laser light beam of such energy content per pulse that the Pd nuclei are removed from the exposed areas and in that an electroless metallization bath is used to metallize the unexposed areas of the substrate thereby forming the metal pattern on the substrate.

2. A method as claimed in claim 1, characterized in that the glass substrate is silanated with an aqueous solution of an alkoxy-aminosilane prior to treatment with the Pd sol and in that the Pd sol is stabilized with a polymer selected from the group consisting of polyvinyl alcohol and polyvinyl pyrrolidone.

3. A method as claimed in claim 2, characterized in that the alkoxy aminosilane is selected from the group consisting of 3-aminopropyl trimethoxysilane and N-(2-aminoethyl)-3-aminopropyl trimethoxysilane.

4. A method as claimed in claim 3, characterized in that the laser light beam originates from an ArF excimer laser having a wavelength of 193 nm and an energy content of at least 30 mJ per pulse per second.

5. A method as claimed in claim 3, characterized in that the laser light beam originates from a Nd-YAG laser having a wavelength of 532 nm and an energy content of at least 900 mJ per pulse per second.

6. A method as claimed in claim 2, characterized in that the laser light beam originates from an ArF excimer laser having a wavelength of 193 nm and an energy content of at least 30 mJ per pulse per second.

7. A method as claimed in claim 2, characterized in that the laser light beam originates from a Nd-YAG laser having a wavelength of 532 nm and an energy content of at least 900 mJ per pulse per second.

8. A method as claimed in claim 1, characterized in that the substrate is silanated, prior to contact with the Pd sol, with an aqueous solution of an alkoxy-aminosilane and that the Pd sol is stabilized with a water-soluble polymer having chains uncharged in said sol.

9. A method as claimed in claim 1, characterized in that the laser light beam originates from an ArF excimer laser having a wavelength of 193 nm and an energy content of at least 30 mJ per pulse per second.

10. A method as claimed in claim 1, characterized in that the laser-light beam originates from a Nd-YAG laser having a wavelength of 532 nm and an energy content of at least 900 mJ per pulse per second.

* * * * *